United States Patent [19]
Zlydak et al.

[11] 3,961,271
[45] June 1, 1976

[54] PULSE WIDTH AND AMPLITUDE SCREENING CIRCUIT

[75] Inventors: Valentine John Zlydak, Clark; Maurice Leon Jezo, Cedar Grove, both of N.J.

[73] Assignee: International Telephone and Telegraph Corporation, Nutley, N.J.

[22] Filed: Feb. 7, 1975

[21] Appl. No.: 547,835

[52] U.S. Cl. .............................. 328/111; 328/115; 328/147; 307/235 N; 307/234
[51] Int. Cl.² ..................... H03K 5/20; G06G 7/14
[58] Field of Search .......................... 328/111–112, 328/115–117, 146, 147; 307/235 N, 234

[56] References Cited
UNITED STATES PATENTS

| | | | |
|---|---|---|---|
| 3,095,541 | 6/1963 | Ashcraft | 307/235 N |
| 3,214,700 | 10/1965 | Hook | 307/235 N |
| 3,456,201 | 7/1969 | Zrubek | 328/116 |
| 3,600,688 | 8/1971 | Booth | 328/112 |
| 3,701,029 | 10/1972 | Hogg | 328/112 |
| 3,710,264 | 1/1973 | Doti et al. | 328/112 |
| 3,790,881 | 2/1974 | Smith | 328/111 |

*Primary Examiner*—Stanley D. Miller, Jr.
*Attorney, Agent, or Firm*—John T. O'Halloran; Menotti J. Lombardi, Jr.; Alfred C. Hill

[57] ABSTRACT

A circuit is provided to produce an output pulse for each analog input pulse whose amplitude and width fall within specified limits. A first amplitude comparator produces a first signal when the amplitude of one of the input pulses exceeds a first reference amplitude and a second amplitude comparator produces a second signal when the width of the one of the input pulses has an amplitude exceeding a second reference amplitude different than the first reference amplitude. Digital circuitry is coupled to the second amplitude comparator to convert the second signal into a binary count, to produce a third signal when the count is greater then a minimum pulse width reference count and to produce a fourth signal when the count is less than a maximum pulse width reference count. A logic gate and pulse generator is coupled to the first amplitude comparator and the digital circuitry responsive to the simultaneous presence of the first, third and fourth signals to produce the circuit output pulse. A system employing a plurality of the above described circuits enables the production of a system output pulse for each analog input pulse whose amplitude and width fall within a given range of amplitudes and a given range of widths with each of the plurality of the above-described circuits having different first and second reference amplitudes to cover the given range of the amplitudes and widths.

13 Claims, 4 Drawing Figures

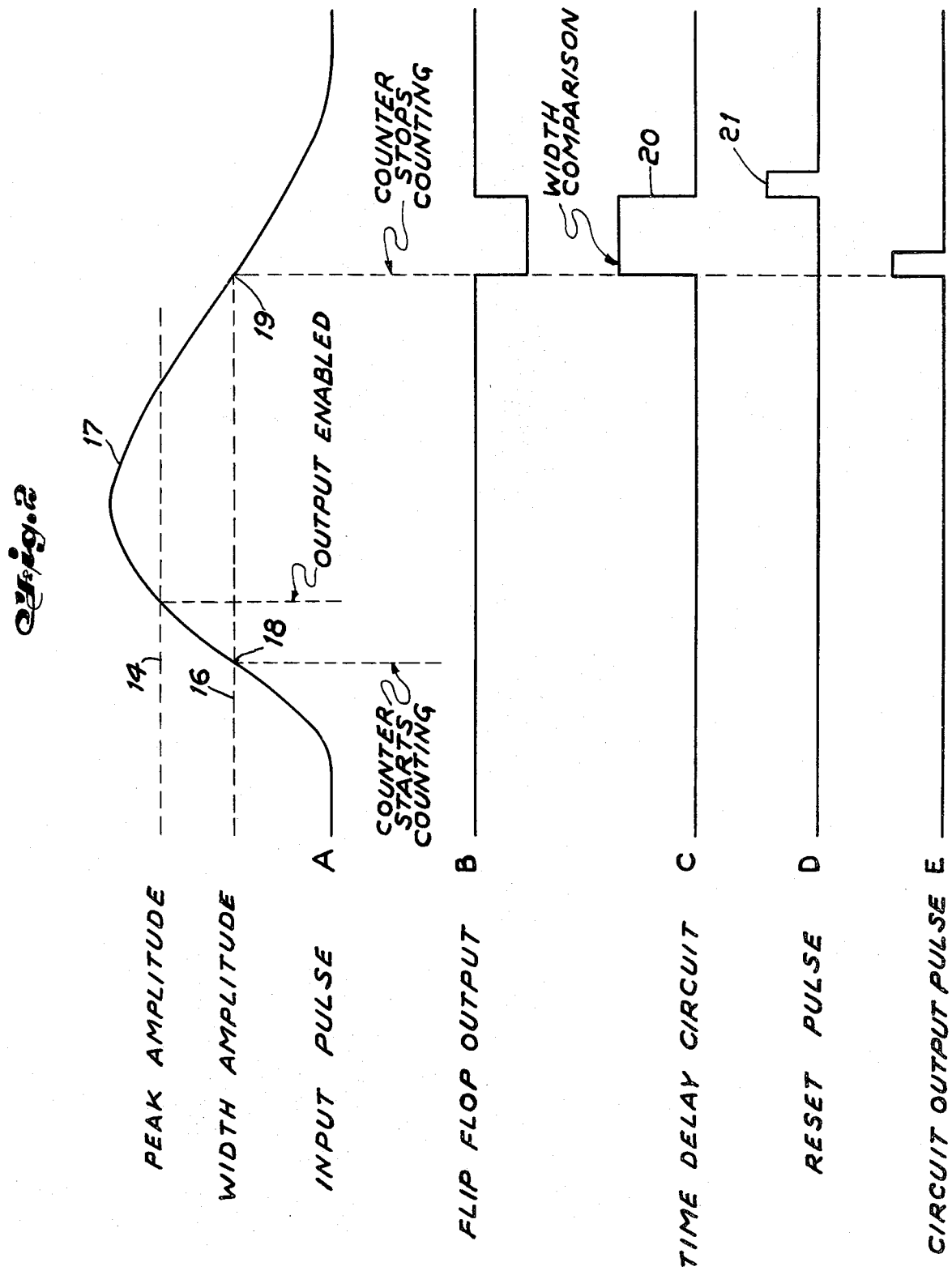

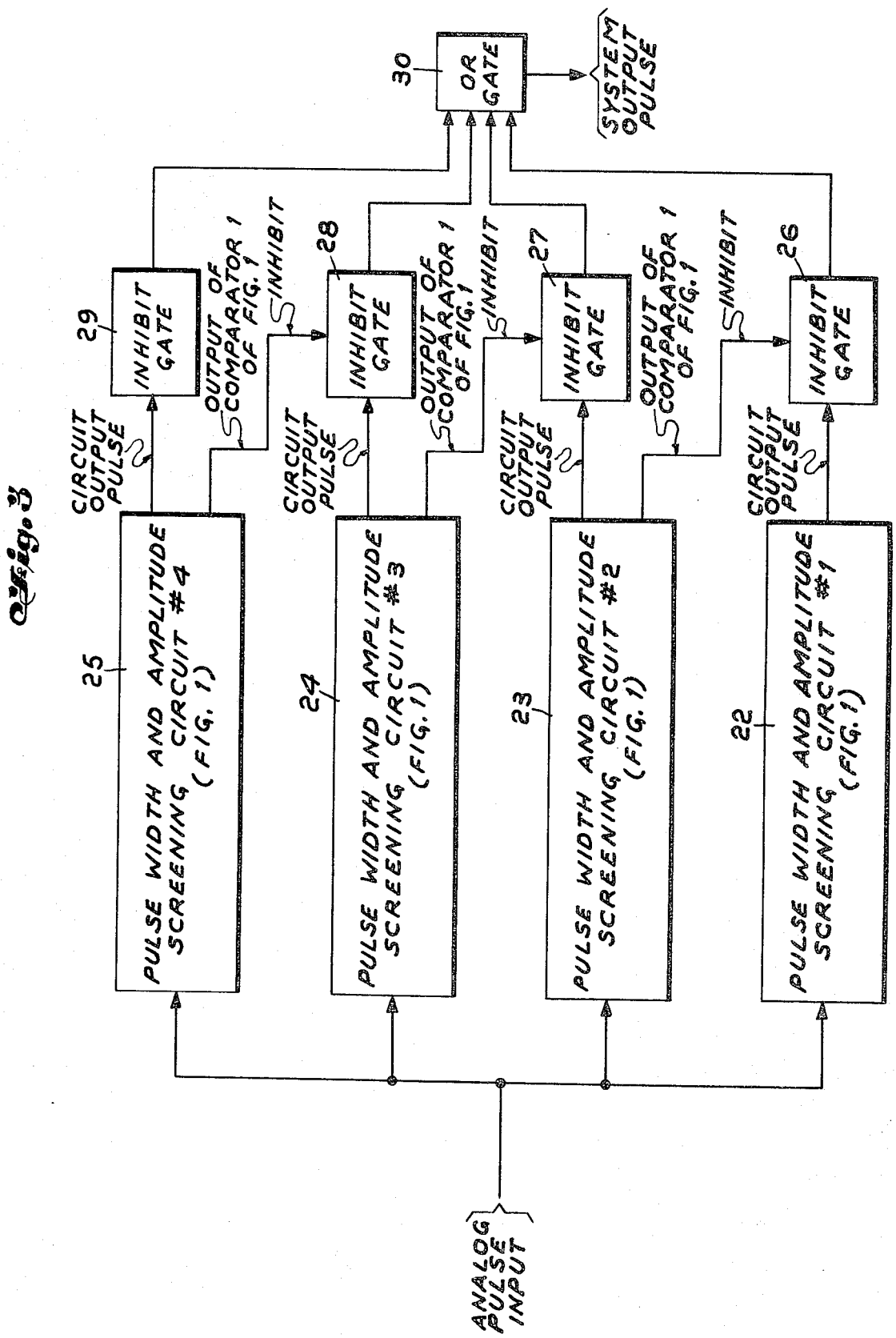

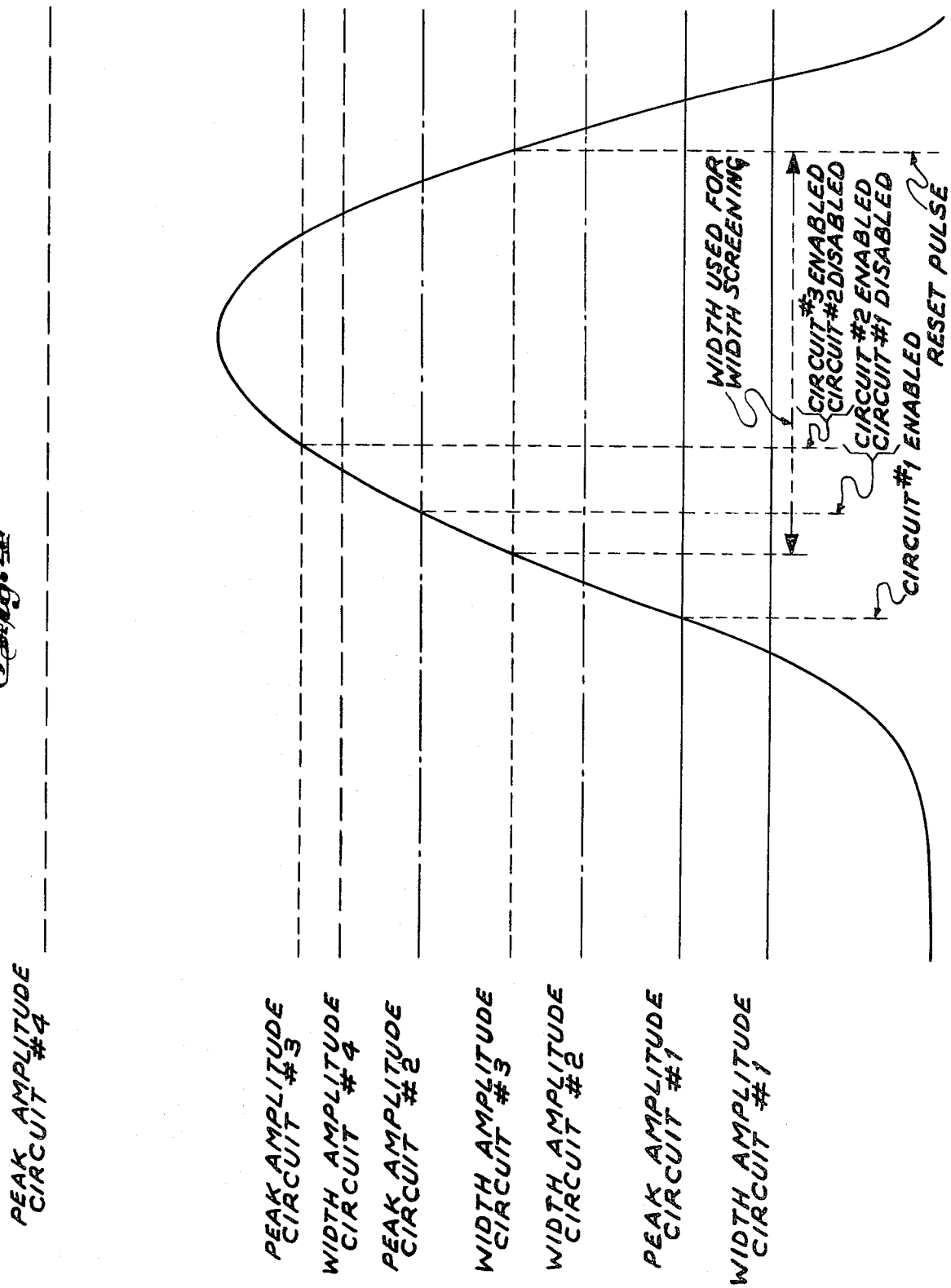

PULSE WIDTH AND AMPLITUDE SCREENING CIRCUIT

BACKGROUND OF THE INVENTION

This invention relates to a circuit to screen received analog pulses on the basis of their width and amplitude.

Such screening circuits have application in IFF (identification friend or foe) and TACAN receiving equipment and other similar equipment requiring screening of a large number of pulses having a wide range of different amplitudes and widths to locate the desired pulses having an amplitude and a width which falls within specified limits.

Prior art pulse width and amplitude screening circuits have been wholly analog in nature with the amplitude being screened by an amplitude comparator and the width being screened by a tapped delay line.

SUMMARY OF THE INVENTION

An object of the present invention is to provide a pulse width and amplitude screening circuit which employs both analog and digital techniques.

Another object of the present invention is the provision of a pulse width and amplitude screening system employing a plurality of pulse width and amplitude screening circuits of the present invention where the analog input pulses have amplitudes and widths covering a given range of amplitudes and widths.

A feature of the present invention is the provision of a pulse width and amplitude screening circuit to provide an output pulse for each analog input pule whose amplitude and width fall within specified limits comprising: a first source of the analog input pulses; first means coupled to the first source to produce a first signal when the amplitude of one of the input pulses exceeds a first reference amplitude; second means coupled to the first source to produce a second signal when the width of the one of the input pulses has an amplitude exceeding a second reference amplitude different than the first reference amplitude; third means coupled to the second means to convert the second signal into a binary count, to produce a third signal when the count is greater than a minimum pulse width reference count and to produce a fourth signal when the count is less than a maximum pulse width reference count; and fourth means coupled to the first means and the third means responsive to the simultaneous presence of said first, third and fourth signals to produce the output pulse.

Another feature of the present invention is the provision of a pulse width and amplitude screening system to provide a system output pulse for each analog input pulse whose amplitude and width fall within a given range of amplitudes and a given range of widths comprising: a first source of the analog input pulses; a plurality of pulse width and amplitude screening circuits, each of the circuits providing a circuit output pulse for each analog input pulse whose amplitude and width fall within different specified limits covering the given range of amplitudes and widths, each of the circuits including first means coupled to the first source to produce a first signal when the amplitude of one of the input pulses exceeds a first reference amplitude, second means coupled to the first source to produce a second signal when the width of the one of the input pulses has an amplitude exceeding a second reference amplitude different than the first reference amplitude, third means coupled to the second means to convert the second signal into a binary count, to produce a third signal when the count is greater than a minimum pulse width reference count and to produce a fourth signal when the count is less than a maximum pulse width reference count, and fourth means coupled to the first means and the third means responsive to the simultaneous presence of the first, third and fourth signals to produce the circuit output pulse; the first and second reference amplitudes being different for each of the plurality of circuits extending from low amplitude values to high amplitude values to cover the given range of amplitudes and widths; a plurality of INHIBIT gates each coupled to a different one of the plurality of circuits and to one of the plurality of circuits having the next higher value for the first and second reference amplitudes when compared to the value of the first and second reference amplitudes of the different one of the plurality of circuits to inhibit the circuit output pulse of the different one of the plurality of circuits when the first signal is present at the output of the one of the plurality of circuits; and an OR gate coupled to each of the INHIBIT gates to provide the system output pulse from the circuit output pulse of the one of the plurality of circuits.

BRIEF DESCRIPTION OF THE DRAWING

Above-mentioned and other features and objects of this invention will become more apparent by reference to the following description taken in conjunction with the accompanying drawing, in which:

FIG. 2 is a set of curves illustrating the waveforms at various points in the circuit of FIG. 1 useful in explaining the operation of the circuit of FIG. 1;

FIG. 3 is a block diagram showing a pulse width and amplitude screening system employing a plurality of circuits of FIG. 1 in accordance with the principles of the present invention; and FIG. 4 is a curve useful in explaining the operation of the system of FIG. 3.

DESCRIPTION OF THE PREFERRED EMBODIMENT

Figure 1:
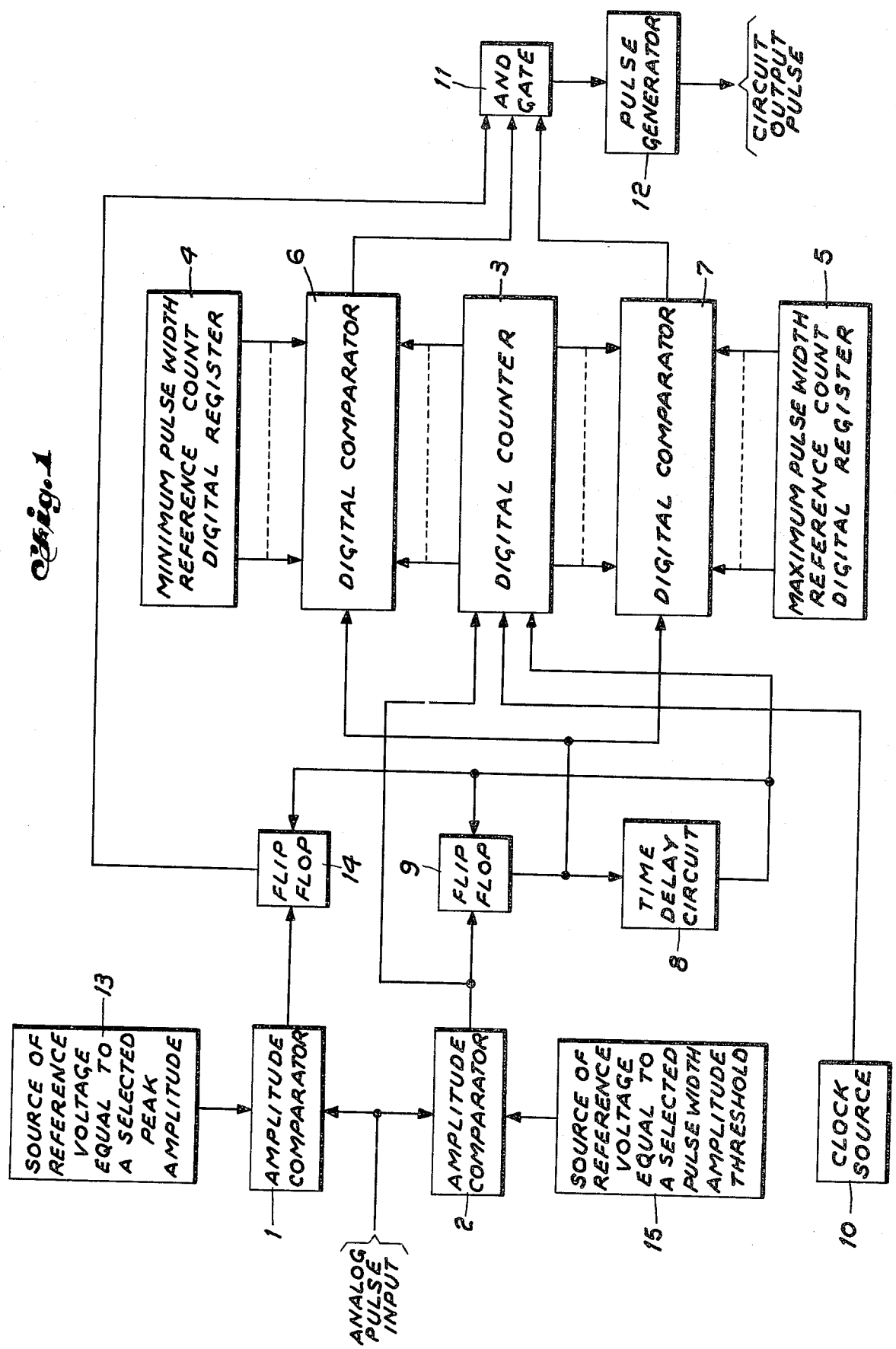
FIG. 1 is a block diagram of a pulse width and amplitude screening circuit in accordance with the principles of the present invention.

The pulse width and amplitude screening circuit of this invention accepts pulses whose amplitude and width fall within specified limits and rejects all other pulses. The input to the circuit is an analog pulse and the output is a digital pulse. The output pulse is generated when an acceptable input pulse is recognized, that is, when the input pulse meets the following two conditions: (a) the input pulse exceeds a given reference amplitude (width amplitude) for a time period which is within the limits of acceptable width, and (b) while the input pulse was higher than the width amplitude this pulse also exceeded another reference amplitude which is the desired peak amplitude.

Referring to FIG. 1, there is illustrated therein a block diagram of the pulse width and amplitude screening circuit in accordance with the principles of the present invention. The circuit comprises amplitude comparators 1 and 2, digital counter 3, digital registers 4 and 5, digital comparators 6 and 7, time delay circuit 8, flip flop 9, clock source 10, logic gate 11 and pulse generator 12.

The circuit of FIG. 1 operates as follows. Amplitude comparator 1 compares the amplitude of the input analog pulse (pulse 17 of Curve A, FIG. 2) with a first reference voltage (dashed line 14 of Curve A, FIG. 2) equal to the desired peak amplitude of the input pulse as provided by source 13. When amplitude comparator produces an output flip flop 14 changes state. Amplitude comparator 2 compares the amplitude of the analog input pulse to a second reference voltage (dashed line 16 of Curve A, FIG. 2) equal to the amplitude of a selected pulse width threshold as provided by source 15.

When the amplitude of pulse input 17 of Curve A, FIG. 2 is higher than the width amplitude reference 16 at point 18 of Curve A, FIG. 2, counter 3 is enabled by the output signal of comparator 2 but flip flop 9 does not change state as shown in Curve B, FIG. 2. The counting of counter 3 is controlled by a clock signal from clock source 10. When the amplitude of the input pulse 17 falls below the width amplitude reference 16 at point 19 of Curve A, FIG. 2, the output signal of comparator 2 disables counter 3 and causes flip flop 9 to change state. When flip flop 9 changes state, time delay circuit 8 is triggered to produce the time delay 8 of Curve E, FIG. 2, and to enable digital comparators 6 and 7. Comparators 6 and 7 compare the time or count accumulated in counter 3 with a minimum pulse width reference count stored in digital register 4 and a maximum pulse width reference count stored in digital register 5 respectively. Registers 4 and 5 can have the reference count stored therein by manually setting a digital register or by a computer which is programmed to provide the desired reference count for storage.

After the time delay of time delay circuit 8 has run out, as shown by the edge 20 of Curve C, FIG. 2, a reset pulse 21, as shown in Curve D, FIG. 2, is generated to reset flip flops 9 and 14 and counter 3.

A gate pulse is provided by AND gate 11 when the output signal of comparator 1 and the output signals of comparators 6 and 7 are simultaneously present at the inputs of AND gate 11 to trigger pulse generator 12 to produce the circuit output pulse as shown in Curve E, FIG. 2. Pulse generator 12 may be implemented by a monostable multivibrator.

Thus, the generation of the circuit output pulse occurs before the reset pulse when and only when all three of the following conditions are met: (a) the time or count accumulated in counter 3 is less than the maximum reference count, (b) the time or count accumulated in counter 3 is more than the minimum reference count and (c) the peak amplitude reference voltage has been exceeded.

The circuit described above is readily usable for pulses whose amplitude is accurately known and, therefore, the width and peak reference voltages are well defined. However, when utilized for pulses of unknown and variable amplitudes the circuit of FIG. 1 is modified to provide accurate decision especially for pulses with long rise and fall time.

The modification of FIG. 1 to handle pulse of unknown and variable amplitudes is shown in block diagram form in FIG. 3. The system of FIG. 3 includes a plurality of the circuits of FIG. 1 illustrated by blocks 22–25. Circuits 22–25 have the structure and operate as illustrated and described with respect to FIG. 1 with the exception that the first and second reference amplitudes from sources 13 and 15 are different for each circuit so as to cover a given range of amplitudes and widths. Circuit 22 would have the lowest values for the first and second reference amplitudes while circuit 25 would have the highest values for these reference amplitudes with values for the first and second reference amplitudes of the circuits 23 and 24 being disposed between the values of the reference amplitudes of circuits 22 and 25 so as to cover the entire range of amplitude and width as shown in FIG. 4.

Each time a peak level is exceeded by the input pulse, the pulse width and amplitude screening circuit whose peak amplitude of first reference amplitude is the next lower is disabled by the operation of INHIBIT gates 26–29. This interlock insures that the width decision is obtained from a single circuit. Of all the peak reference amplitudes (the first reference amplitude) which have been exceeded by the amplitude of the input pulse, the circuit having the highest first reference amplitude is retained to provide the width decision and the circuit output pulse thereof is passed through the associated one of gates 26–29 and hence through OR gate 30 to provide the system output pulse.

FIG. 4 shows as an example that circuit 24 (circuit No. 3) is selected to provide the width decision.

While we have described above the principles of our invention in connection with specific apparatus, it is to be clearly understood that this description is made only by way of example and not as a limitation to the scope of our invention as set forth in the objects thereof and in the accompanying claims.

We claim:

1. A pulse width and amplitude screening circuit to provide an output pulse for each input pulse whose amplitude and width fall within specified limits comprising:
   a first source of said analog input pulses;
   first means coupled to said first source to produce a first signal when the amplitude of one of said input pulses exceeds a first reference amplitude;
   second means coupled to said first source to produce a second signal when the width of said one of said input pulses has an amplitude exceeding a second reference amplitude different than said first reference amplitude;
   third means coupled to said second means to convert said second signal into a binary count, to produce a third signal when said count is greater than a minimum pulse width reference count and to produce a fourth signal when said count is less than a maximum pulse width reference count; and
   fourth means coupled to said first means and said third means responsive to the simultaneous presence of said first, third and fourth signals to produce said output pulse.

2. A circuit according to claim 1, wherein
   said first reference signal is a first voltage equal to an expected peak amplitude of an input pulse, and
   said second reference signal is a second voltage equal to an expected amplitude related to the width of an input pulse, said second voltage being less than said first voltage.

3. A circuit according to claim 1, wherein
   said first means includes
     a second source of voltage equal to said first reference amplitude, and
     an amplitude comparator coupled to said first and second sources to produce said first signal.

4. A circuit according to claim 1, wherein
   said second means includes a second source of voltage equal to said second reference amplitude, and an amplitude comparator coupled to said first and second sources to produce said second signal.

5. A circuit according to claim 1, wherein said third means includes a flip flop coupled to said second means, said flip flop changing state at the time of transistion of said second signal from a high condition to a low condition, a digital counter coupled to said second means, said counter being enabled at the time of transition of said second signal from a low condition to a high condition and disabled at the time of transition of said second signal from a high condition to a low condition, a second source of clock coupled to said counter to control the counting thereof, a time delay circuit coupled to said flip flop and said counter to reset said flip flop and said counter after a given time delay from the time said flip flop changes state, a first digital register storing a minimum pulse width reference count, a second digital register storing a maximum pulse width reference count, a first digital comparator coupled to said counter and said first register to produce said third signal, and a second digital comparator coupled to said counter and said second register to produce said fourth signal.

6. A circuit according to claim 1, wherein said fourth means includes a logic gate coupled to said first means and said third means to produce a gate signal in response to the simultaneous presence of said first, third and fourth signals, and a pulse generator coupled to said logic gate responsive to said gate signal to produce said output pulse.

7. A circuit according to claim 1, wherein said first means includes a second source of voltage equal to said first reference amplitude, and a first amplitude comparator coupled to said first and second sources to produce said first signal;

said second means includes a third source of voltage equal to said second reference amplitude, and a second amplitude comparator coupled to said first and third sources to produce said second signal; said third means includes a flip flop coupled to said second amplitude comparator, said flip flop changing state at the time of transition of said second signal from a high condition to a low condition.

a digital counter coupled to said second amplitude comparator, said counter being enabled at the time of transition of said second signal from a low condition to a high condition and disabled at the time of transition of said second signal from a high condition to a low condition, a fourth source of clock coupled to said counter to control the counting thereof, a time delay circuit coupled to said flip flop and said counter to reset said flip flop and said counter after a given time delay from the time said flip flop changes state, a first digital register storing a minimum pulse width reference count, a second digital register storing a maximum pulse width reference count, a first digital comparator coupled to said counter and said first register to produce said third signal, and a second digital comparator coupled to said counter and said second register to produce said fourth signal; and said fourth means includes a logic gate coupled to said first amplitude comparator, said first digital comparator and said second digital comparator to produce a gate signal in response to the simultaneous presence of said first, third and fourth signals, and a pulse generator coupled to said logic gate responsive to said gate signal to produce said output pulse.

8. A pulse width and amplitude screening system to provide a system output pulse for each analog input pulse whose amplitude and width fall within a given range of amplitudes and a given range of widths comprising:

a first source of said analog input pulses;

a plurality of pulse width and amplitude screening circuits, each of said circuits being coupled to said first source and providing a circuit output pulse for each analog input pulse whose amplitude and width fall within different specified limits covering said given range of amplitudes and widths, each of said circuits including first means coupled to said first source to produce a first signal when the amplitude of one of said input pulses exceeds a first reference amplitude, second means coupled to said first source to produce a second signal when the width of said one of said input pulses has an amplitude exceeding a second reference amplitude different than said first reference amplitude, third means coupled to said second means to convert said second signal into a binary count, to produce a third signal when said count is greater than a minimum pulse width reference count and to produce a fourth signal when said count is less than a maximum pulse width reference count, and fourth means coupled to said first means and said third means responsive to the simultaneous presence of said first, third and fourth signals to produce said circuit output pulse;

said first and second reference amplitudes being different for each of said plurality of circuits extending from low amplitude values to high amplitude values to cover said given range of amplitudes and widths;

a plurality of INHIBIT gates each coupled to a different one of said plurality of circuits and to one of said plurality of circuits having the next higher value for said first and second reference amplitudes when compared to the value for said first and second reference amplitudes of said different one of said plurality of circuits to inhibit said circuit output pulse of said different one of said plurality of circuits when said first signal is present at the output of said one of said plurality of circuits; and an OR gate coupled to each of said INHIBIT gates to provide said system output pulse from said circuit output pulse of said one of said plurality of circuits.

9. A system according to claim 8, wherein each of said first means includes
a second source of voltage equal to said first reference amplitude, and
an amplitude comparator coupled to said first and second sources to produce said first signal.

10. A system according to claim 8, wherein each of said second means includes
a second source of voltage equal to said second reference amplitude, and
an amplitude comparator coupled to said first and second sources to produce said second signal.

11. A system according to claim 1, wherein each of said third means includes
a flip flop coupled to said second means, said flip flop changing state at the time of transition of said second signal from a high condition to a low condition,
a digital counter coupled to said second means, said counter being enabled at the time of transition of said second signal from a low condition to a high condition and disabled at the time of transition of said second signal from a high condition to a low condition,
a second source of clock coupled to said counter to control the counting thereof,
a time delay circuit coupled to said flip flop and said counter to reset said flip flop and said counter after a given time delay from the time said flip flop changes state,
a first digital register storing a minimum pulse width reference count,
a second digital register storing a maximum pulse width reference count,
a first digital comparator coupled to said counter and said first register to produce said third signal, and
a second digital comparator coupled to said counter and said second register to produce said fourth signal.

12. A system according to claim 8, wherein each of said fourth means includes
a logic gate coupled to said first means and said third means to produce a gate signal in response to the simultaneous presence of said first, third and fourth signals, and
a pulse generator coupled to said logic gate responsive to said gate signal to produce said output pulse.

13. A system according to claim 8, wherein each of said first means includes
a second source of voltage equal to said first reference amplitude, and
a first amplitude comparator coupled to said first and second sources to produce said first signal;
each of said second means includes
a third source of voltage equal to said second reference amplitude, and
a second amplitude comparator coupled to said first and third sources to produce said second signal;
each of said third means includes
a flip flop coupled to said second amplitude comparator, said flip flop changing state at the time of transition of said second signal from a high condition to a low condition,
a digital counter coupled to said second amplitude comparator, said counter being enabled at the time of transition of said second signal from a low condition to a high condition and disabled at the time of transition of said second signal from a high condition to a low condition,
a fourth source of clock coupled to said counter to control the counting thereof,
a time delay circuit coupled to said flip flop and said counter to reset said flip flop and said counter after a given time delay from the time said flip flop changes state,
a first digital register storing a minimum pulse width reference count,
a second digital register storing a maximum pulse width reference count,
a first digital comparator coupled to said counter and said first register to produce said third signal, and
a second digital comparator coupled to said counter and said second register to produce said fourth signal; and each of said fourth means includes
a logic gate coupled to said first amplitude comparator, said first digital comparator and said second digital comparator to produce a gate signal in response to the simultaneous presence of said first, third and fourth signals, and
a pulse generator coupled to said logic gate responsive to said gate signal to produce said output pulse.

\* \* \* \* \*